United States Patent [19]
Houston

[11] Patent Number: 6,061,267
[45] Date of Patent: May 9, 2000

[54] MEMORY CIRCUITS, SYSTEMS, AND METHODS WITH CELLS USING BACK BIAS TO CONTROL THE THRESHOLD VOLTAGE OF ONE OR MORE CORRESPONDING CELL TRANSISTORS

[75] Inventor: Theodore W. Houston, Richardson, Tex.

[73] Assignee: Texas Instruments Incorporated, Dallas, Tex.

[21] Appl. No.: 09/161,903

[22] Filed: Sep. 28, 1998

[51] Int. Cl.$^7$ .................................................. G11C 11/00
[52] U.S. Cl. ...................... 365/154; 365/226; 365/189.09
[58] Field of Search .................................... 365/154, 226, 365/189.09

[56] References Cited

U.S. PATENT DOCUMENTS

| | | | |
|---|---|---|---|
| 5,600,588 | 2/1997 | Kawashima | 365/154 |
| 5,706,226 | 1/1998 | Chan et al. | 365/154 |
| 5,708,599 | 1/1998 | Sato et al. | 365/154 |

*Primary Examiner*—David Nelms
*Assistant Examiner*—Van Thu Nguyen
*Attorney, Agent, or Firm*—Robby T. Holland; Carlton H. Hoel; Frederick J. Telecky, Jr.

[57] ABSTRACT

A memory configuration (20). The memory configuration comprises a plurality of memory cells (SCl1, SCl2, SCl3) arranged in a plurality of rows and columns. The memory configuration also comprises a plurality of wordlines ($WL_0$–$WL_N$). Each of the plurality of wordlines corresponds to one of the plurality of rows and is operable during a period to provide a gate bias to select the row corresponding to the wordline such that other rows in the plurality of rows are non-selected rows during the period. In addition, each of the plurality of memory cells comprises at least one transistor (e.g., AT3) coupled to receive a back bias. The memory configuration also comprises circuitry for providing a first back bias operable to cause only the at least one transistor in each of the memory cells in the selected row (e.g., $WL_0$) to have a first threshold voltage, and circuitry for providing a second back bias operable to cause the at least one transistor in each of the memory cells in at least some of the non-selected rows to have a second threshold voltage. The first threshold voltage is different than the second threshold voltage.

11 Claims, 7 Drawing Sheets

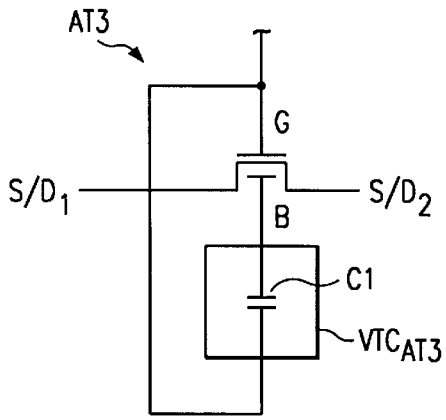 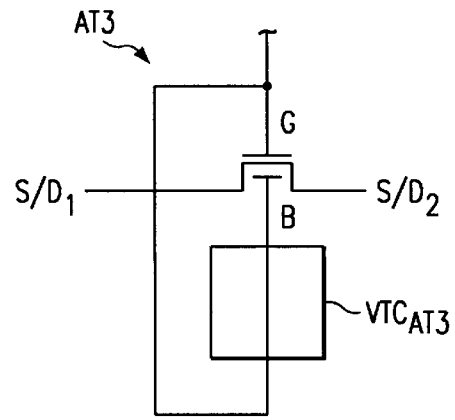
FIG. 4a    FIG. 4b
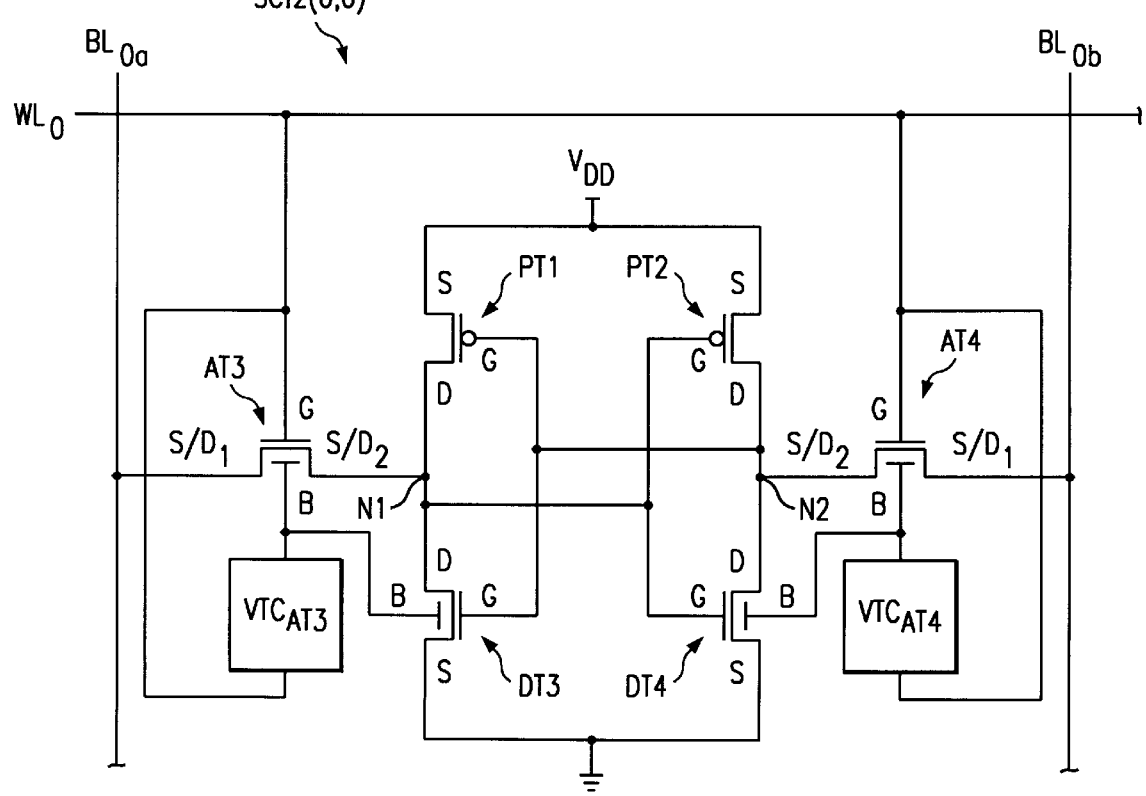
FIG. 5

MEMORY CIRCUITS, SYSTEMS, AND METHODS WITH CELLS USING BACK BIAS TO CONTROL THE THRESHOLD VOLTAGE OF ONE OR MORE CORRESPONDING CELL TRANSISTORS

CROSS-REFERENCES TO RELATED APPLICATIONS

This application is a continuation-in-part application of U.S. patent application Ser. No. 08/695,495, filed Aug. 12, 1996, entitled "Deep Mesa Isolation," having the same inventor as the present application, which is a divisional of U.S. patent application Ser. No. 08/412,429, filed Mar. 29, 1995, issued Aug. 18, 1998 as U.S. Pat. No. 5,795,810, entitled "Deep Mesa Isolation In SOI," having the same inventor as the present application.

STATEMENT REGARDING FEDERALLY SPONSORED RESEARCH OR DEVELOPMENT

Not Applicable.

BACKGROUND OF THE INVENTION

The present embodiments relate to memory circuits, and are more particularly directed to such circuits and related systems and methods where, for each memory cell, the wordline bias is used to control the threshold voltage of one or more corresponding cell transistors.

The technology of many modern circuit applications continues to advance at a rapid pace, with one incredibly prolific type of circuit, and one which is highly developed, being digital memory. For such memories, consideration is given to all aspects of design, including maximizing efficiency and increasing performance. These considerations may be further evaluated based on the integrated circuit device in which the memory is formed, where such circuits may be implemented either as stand-alone products, or as part of a larger circuit such as a microprocessor. One often critical factor with respect to digital memories is the tradeoff between current leakage and access speed. Another factor is the cost of the device and this cost is often affected by the overall size and/or layout of the memory architecture. Thus, a desirable memory provides an acceptable level of current leakage and access speed, along with a price which is acceptable given the system or environment in which the memory will be implemented.

In the present state of the art, the tradeoff in memory design between current leakage and access speed may be handled in various ways. For example, it is known that a transistor's threshold voltage affects both its current leakage and the speed with which the transistor conducts. Relatively speaking, a transistor with a high threshold voltage provides a lower current leakage and a slower conduction speed when compared to a transistor with a low threshold voltage. Given these characteristics, one known memory technique is to include transistors in a memory circuit having differing threshold voltages, where transistors performing one function have a first threshold voltage while transistors performing a different function have a second threshold voltage different than the first threshold voltage. For example, one of the functions may involve address receipt and decoding, while another function may be actual access to the information stored by a memory cell. This approach, however, may suffer various drawbacks. For example, even with differing threshold voltages, once a threshold voltage is set for a given transistor, that transistor is still constrained to provide a fixed amount of current leakage and a corresponding conduction speed. Other drawbacks will be ascertainable by one skilled in the art, and may increase device complexity and cost.

By way of further background, U.S. Pat. No. 5,610,533, issued Mar. 11, 1997, and is entitled "Switched Substrate Bias For Logic Circuits" (the '533 Patent). The '533 Patent discloses numerous embodiments, some of which are directed to DRAM memory cells. For these DRAM cells, the '533 Patent proposes altering the threshold voltages of various of the transistors associated with the DRAM. More particularly, switch circuits are disclosed and operate to connect different back biases either directly to the well of a bulk transistor or directly to the body of a silicon-on-insulator (SOI) transistor. In either case, by varying the back bias to the transistors, the threshold voltage of the controlled transistor is controlled to a different level. For example, during a de-activation period when it is not desired to access the DRAM, the switch circuits increase the threshold voltage of the transistors, thereby reducing current leakage during that period. Conversely, during an activation period when it is desired to access the DRAM, the switch circuits decrease the threshold voltage of the transistors, thereby increasing the conduction speed of the transistor as compared to what it would be if the threshold voltage were left at the level to which it is set during the de-activation period. This approach, however, also may suffer various drawbacks. For example, the '533 Patent discloses controlling all DRAM transistors in the memory array with the same single control circuit(s). Consequently, when the threshold voltage switch occurs, it is applied to all memory cells in the array. During activation, therefore, such an approach may therefore cause leakage in those cells which in fact are not to be accessed by an incoming address. As another drawback, the specific technique of connecting the switch circuits to the controlled transistors is not described in the '533 Patent from a semiconductor layout standpoint and, thus, it is left to one skilled in the art to minimize the vast potential for increasing device size and complexity. As still another example, the switch circuits required to accomplish the threshold voltage changes in the '533 Patent also necessarily increase device size and complexity. As still another example, the '533 Patent is limited to DRAM memories. Still other drawbacks will be ascertainable by one skilled in the art.

Given the above, the preferred embodiments described below further address the aforementioned considerations and drawbacks, and thereby provide a more efficient and desirable integrated circuit configuration.

BRIEF SUMMARY OF THE INVENTION

In one embodiment, there is a memory configuration. The memory configuration comprises a plurality of memory cells arranged in a plurality of rows and columns. The memory configuration also comprises a plurality of wordlines. Each of the plurality of wordlines corresponds to one of the plurality of rows and is operable during a period to provide a gate bias to select the row corresponding to the wordline such that other rows in the plurality of rows are non-selected rows during the period. In addition, each of the plurality of memory cells comprises at least one transistor coupled to receive a back bias. The memory configuration also comprises circuitry for providing a first back bias operable to cause the at least one transistor in each of the memory cells in the selected row to have a first threshold voltage, and circuitry for providing a second back bias operable to cause the at least one transistor in each of the memory cells in at least some of the non-selected rows to have a second threshold voltage. The first threshold voltage is different than the second threshold voltage. Other circuits, systems, and methods are also disclosed and claimed.

BRIEF DESCRIPTION OF THE SEVERAL VIEWS OF THE DRAWING

FIG. 1b illustrates a prior art schematic of a 6T memory cell circuit which may be used for each of the storage cells in FIG. 1a;

FIG. 2b illustrates various diode and capacitor effects of the configuration of the SOI transistor of FIG. 2a;

FIG. 4a illustrates a schematic of a first embodiment in which the body-to-wordline coupling of FIG. 3 may be achieved;

FIG. 4b illustrates a schematic of a second embodiment in which the body-to-wordline coupling of FIG. 3 may be achieved;

FIG. 5 illustrates a schematic of a memory cell in accordance with the present inventive embodiments, wherein the bodies of the access transistors and the drive transistors in the cell are coupled to the wordline for the cell;

DETAILED DESCRIPTION OF THE INVENTION

As an introduction before proceeding with a detailed discussion of the preferred inventive embodiments, FIGS. 1a through 2b as well as the following discussion present an explanation of a prior art integrated circuit 10 including a memory configuration 20. Integrated circuit 10 is typical of that in the art and, thus, includes components formed using a semiconductor substrate and various layers formed above that substrate. In the present example, integrated circuit 10 implements silicon-on-insulator ("SOI") technology. As known in the art, therefore, an insulator layer (typically silicon dioxide) is formed over the entire semiconductor substrate, and various devices are then formed over this insulator. To form these additional devices, a layer of silicon is placed over the insulator, thereby giving rise to the SOI name. Moreover, this silicon layer is then appropriately etched and doped to form various desired devices. To better appreciate these principles for the example of memory configuration 20, the layout of an SOI transistor is discussed below in connection with FIG. 2a. Before reaching that discussion, however, certain schematic details are first addressed in the context of FIGS. 1a and 1b.

Figure 1A:
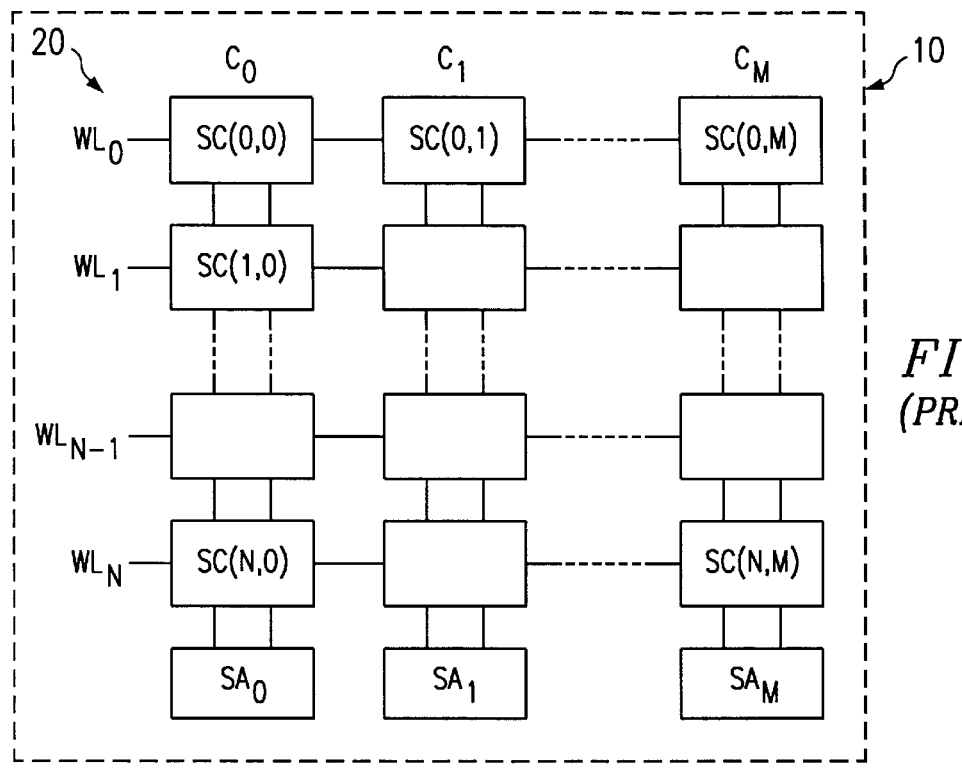
FIG. 1a illustrates a prior art integrated circuit including a memory configuration formed in an array fashion and having a plurality of memory storage cells, and wherein the various inventive cells described herein may be substituted into the memory configuration.

Looking in detail to FIG. 1a, it illustrates a prior art memory configuration 20 generally in a combined block and schematic form. Memory configuration 20 is generally connected in an array form, thereby presenting a number of wordlines $WL_0$ through $WL_N$ aligned along rows in the x-dimension and a number of columns $C_0$ through $C_M$ each aligned in the y-dimension. At the intersection of each wordline and column is a storage cell abbreviated SC, and some of which are shown by way of example as having a coordinate (WL,C) such that the first element specifies the wordline corresponding to the storage cell and the second element specifies the column corresponding to the storage cell. The array nature of memory configuration 20 permits either writing data to, or reading data from, a storage cell on a wordline (i.e., row) basis. In other words, a row may be selected where one or more storage cells along the same wordline may be accessed (i.e., for either read or write) at a time.

Memory configuration 20 is representative of a static random access memory (SRAM) and, consequently, for each column a pair of conductors extends between storage cells along the column, where these conductors are referred to in the art as bitlines. The bitlines permit either reading or writing of a cell connected to a given pair of bitlines, as introduced generally here and as detailed further in connection with FIG. 1b, below. Turning first to an introduction of these operations, for purposes of writing data to the cell, one of the two bitlines is pulled down with some external write circuit (not shown), and then the wordline of the cell is asserted to provide a gate bias to the cell and to allow a write of the data state to the cell in response to the pulled down bitline. For purposes of reading data from the cell, the two bitlines for a given cell provide two respective signals which are compared to one another to determine the data stored at a cell along a selected one of the wordlines. More specifically, the signals provided by each bitline pair in FIG. 1a are connected to corresponding sense amplifier circuits, shown as $SA_0$ through $SA_M$. For purposes of discussion, the subscript of each of the sense amplifier circuits matches that of the column to which it corresponds. Each of sense amplifier circuits $SA_0$ through $SA_M$ includes circuitry for "sensing" the differential voltage along the paired bitlines by amplifying it. Typically, the differential voltage is either amplified to a full scale signal, or there may be stages which amplify the current drive to some level having a lesser signal swing than a full scale signal. This signal may then be used either by other circuitry, either internally on integrated circuit 10 or external from that device. Note also that FIG. 1a illustrates each sense amplifier circuit as connected only to a single pair of corresponding column conductors by way of example, whereas other variations may exist in the correlation between column conductors and sense amplifier circuits. In other words, as an alternative to that shown in FIG. 1a, an embodiment may be created where more than two bitlines are connected by some multiplexing functionality to a single sense amplifier circuit; thus, one pair of these bitlines may then be selected at a time to provide a differential signal to the sense amplifier circuit. Finally, note that while configuration 20 illustrates a single array, such an array or other comparable memory arrays may be divided into blocks, such as through the use of global wordlines which selectively activate local wordlines.

Figure 1B:
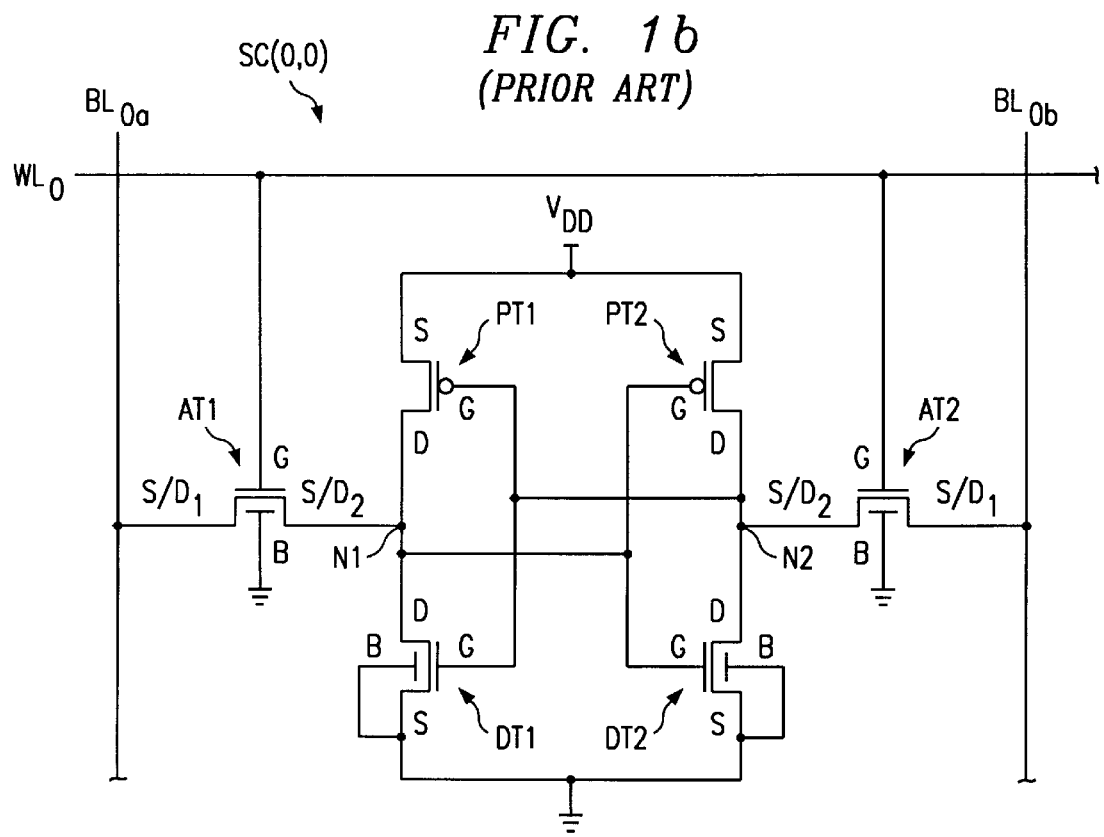

FIG. 1b illustrates a schematic of prior art storage cell SC(0,0) in greater detail, with it understood that each of the remaining storage cells of FIG. 1a is constructed in the same manner (yet, of course, connected to a different one of either a wordline or pair of bitlines, or both). At the outset, note for further discussion that the bitlines from column 0 of FIG. 1a are designated in FIG. 1b with the abbreviation "$BL_0$", and are further distinguished from one another by adding one of the letters "a" and "b" to the subscripts for these conductors. Storage cell SC(0,0) is what is referred to in the art as a 6T cell, meaning it includes six transistors. For purposes of presenting a basis for a functional description below, each of these transistors is further referred to by combining the word "transistor" with a descriptive term relating to the function of the transistor. In this regard, storage cell SC(0,0) includes two access transistors AT1 and AT2, two pull-up transistors PT1 and PT2, and two drive transistors DT1 and DT2. Note that the functional terms "access" and "drive" are chosen to facilitate an understanding by one skilled in the art but not by way of limitation, as other terms are also sometimes used in the art for such transistors. For example, the access transistor are sometimes referred to as passgate transistors. As another example, the drive transistors are sometimes referred to as pull-down transistors. In any event, from the additional details including the connection and function of each of these transistors as provided below, one skilled in the art will appreciate those transistors which are the subject of the present inventive embodiments, regardless of the particular terminology directed to such transistors.

Turning first to the two access transistors AT1 and AT2, both are n-channel transistors and are connected in a symmetric manner. Accordingly, the following discussion first addresses access transistor AT1 followed by a brief discussion of the similar nature of access transistor AT2. The gate of access transistor AT1 is connected to wordline $WL_0$. As a transistor, access transistor AT1 has two typically symmetric regions which are commonly characterized as source and drain regions. Specifically, often for a transistor, one of these regions is referred to as the source while the other is the drain, based on the relative potentials connected to those regions. However, in an implementation such as storage cell SC(0,0), the potential at either region may swing relative to the other and, thus, a given region may in one instance be considered the source while in another instance may be considered the drain. For this reason, from this point forward and also for the remaining comparable transistors discussed in this document each region is referred to as a source/drain. Given that convention, access transistor AT1 has two source/drains $S/D_1$ and $S/D_2$. Source/drain $S/D_1$ is connected to bitline $BL_{0a}$ and source/drain $S/D_2$ is connected to a node N1. Looking now to access transistor AT2, its gate is also connected to wordline $WL_0$. A first source/drain $S/D_1$ of access transistor AT2 is connected to bitline $BL_{0b}$ while a second source/drain $S/D_2$ of access transistor AT2 is connected to a node N2. Lastly and of key note for purposes of appreciating the preferred embodiments described later, note that for both access transistors AT1 and AT2, the body of each is connected to ground. This connection is fairly typical in the SOI art, and is typically done to ensure that the body of the SOI transistor is connected to some known potential to avoid capacitive and other effects described later. As an alternative in the prior art, the bodies of access transistors AT1 and AT2 may be left floating.

Looking now to pull-up transistors PT1 and PT2, both are p-channel transistors and connected in a symmetric manner. Turning first to pull-up transistor PT1, its source is connected to a relatively high voltage, which is shown as $V_{DD}$ as is customary in the transistor art. The drain of pull-up transistor PT1 is connected to node N1. Lastly, the gate of pull-up transistor PT1 is connected to two other points. First, the gate is connected to the gate of drive transistor DT1. Second, the gate is connected to node N2. Looking now to pull-up transistor PT2, its source is connected to $V_{DD}$ and its drain is connected to node N2. The gate of pull-up transistor PT2 is connected to the gate of drive transistor DT2 and to node N1. In the prior art, the bodies of pull-up transistors PT1 and PT2 are left floating, as illustrated in FIG. 1b, or are connected to the sources of pull-up transistors PT1 and PT2, respectively, and hence to $V_{DD}$.

With reference to drive transistors DT1 and DT2, both are n-channel transistors and also are connected in a symmetric manner. Turning first to drive transistor DT1, its source is connected to ground and its drain is connected to node N1. The gate of drive transistor DT1, as mentioned above, is connected to the gate of pull-up transistor PT1 and to node N2. Lastly, the body of drive transistor DT1 is connected to the source of drive transistor DT1 (and, hence, to ground). This body connection (as well as that of drive transistor DT2 described below) again is common in the SOI art to ensure that the body of the SOI transistor is connected to some known potential for avoiding capacitive and other effects described later. Looking now to drive transistor DT2, its source is connected to ground and its drain is connected to node N2. The gate of drive transistor DT2 is connected to the gate of pull-up transistor PT2 and to node N1, and the body of drive transistor DT2 is connected to the source of drive transistor DT2 (and, hence, to ground). As an alternative in the prior art, the bodes of drive transistors DT1 and DT2 may be left floating.

In operation, a binary value may be either written to, or read from, storage cell SC(0,0). When power is first applied to storage cell SC(0,0), it will assume one of two binary states, with the state being understood as random at this initial point of operation. The typical cases of either a subsequent write of data to storage cell SC(0,0), or a read from storage cell SC(0,0), are each discussed separately below.

A write to storage cell SC(0,0) is as follows. First, one of bitlines $BL_{0a}$ and $BL_{0b}$ is pulled low by some write circuit (not shown) while the other remains high. For an example, assume that bitline $BL_{0a}$ is pulled low and, thus, bitline $BL_{0b}$ remains high. Next, wordline $WL_0$ is selected by asserting a high signal along the wordline, which thereby enables access transistors AT1 and AT2 by placing the high signal as a gate bias to the gates of those transistors; in this regard, note that the term "enable" is intended as known in the art to indicate that a sufficient gate-to-source potential is provided such that the transistor channel fully conducts. Additionally, although other storage cells are not shown in FIG. 1b, note that other cells which likewise have access transistors connected to wordline $WL_0$ are concurrently enabled for writing due to the enabling signal on wordline $WL_0$. Returning to storage cell SC(0,0), the enabling of access transistor AT1 connects node N1 to the low potential at bitline $BL_{0a}$. Due to the relative current drive capabilities of the transistors of storage cell SC(0,0) as further detailed below, bitline $BL_{0a}$ pulls node N1 low. With node N1 low, pull-up transistor PT2 is enabled and drive transistor DT2 is disabled, thereby bringing node N2 to $V_{DD}$, which is further connected to the gate of drive transistor DT1 and, therefore, enables drive transistor DT1. Since drive transistor DT1 is enabled, node N1 continues to be pulled to ground and, thus, maintains node N1 at ground even after wordline $WL_0$ is no longer enabling to access transistors AT1 and AT2. Consequently, storage cell SC(0,0) will maintain the stored data state until it is thereafter changed by a subsequent write operation. Lastly, note that the relative timing of the signals on the bitline and the wordline may vary in different implementations.

A read from storage cell SC(0,0) is as follows. At the outset, for the sake of the following example, assume that the following read occurs after the above-described write and, thus, node N1 is maintained low while node N2 is maintained high. Turning to the read operation, first both bitlines $BL_{0a}$ and $BL_{0b}$ are precharged high. Second, wordline $WL_0$ is selected, once again enabling access transistors AT1 and AT2 by applying a gate bias to those transistors. Next, and again due to the differing drive current capabilities of the cell transistors as detailed below, the low signal at node N1 is effectively transferred to $BL_{0a}$; more particularly, the combination of the enabled access transistor AT1 and the enabled drive transistor DT1 pulls the precharged voltage of bitline $BL_{0a}$ low. At the same time, however, the precharged voltage at bitline $BL_{0b}$ is not disturbed. Consequently, sense amplifier $SA_0$ (see FIG. 1a) next amplifies the differential voltage between bitlines $BL_{0a}$ and $BL_{0b}$, thereby providing a voltage which based on the relative values between those bitlines represents a binary state for storage cell SC(0,0).

Having now described both the write and read operations with respect to storage cell SC(0,0), recall that for both operations it was mentioned that the drive current capabilities of the transistors in the cell are relevant to ensure proper operation. More specifically, note that proper operation is obtained by the following relative order of drive current capability for the transistors in storage cell SC(0,0):

drive current(DT)>drive current(AT)>drive current(PT)

The above demonstrates, therefore, that the drive current capability of the drive transistors is larger than the drive current capability of the access transistors, and the drive current capability of the access transistors is larger than the drive current capability of the pull-up transistors. Given this ordering, note the following two observations by way of introduction, and as detailed later. As a first observation, note that the drive current of a transistor may be affected by various factors, such as the conductivity type of the transistor, its size, and lastly as detailed later, its threshold voltage. As a second observation, note that given the above order, proper operation occurs because a high bitline may be pulled low through a corresponding enabled access transistor AT1 or AT2, but a high charge on a bitline cannot pull, through the corresponding access transistor AT1 or AT2, a low node N1 or N2 high. This latter point is illustrated through an example below.

To demonstrate the effect of the drive current order depicted above as well as the effect if that order is violated, assume as an example that the above order is disturbed such that the drive current of the cell's access transistors are too high relative to the drive current of the cell's drive transistors. Given this assumption, note the possibility of erroneous operation during a read operation. Specifically, recall for a proper read operation that both bitlines are precharged high, and one is subsequently pulled low through a corresponding access transistor based on the corresponding low node N1 or N2. However, if the current drive capability of the access transistor is relatively high, then once the access transistors are enabled by the wordline then the low node N1 or N2 may be mistakenly pulled high, rather than the bitline being pulled low as intended. Consequently, both nodes N1 and N2 would be high at that point, potentially upsetting the information stored in the cell. Other examples of the effect of the above current drive ordering will be appreciated by one skilled in the art.

As introduced briefly above, one factor influencing a transistor's current drive capability is its threshold voltage. Thus, to maintain the desired relative current drives of the transistors described above, it is also desirable to consider the effects of each transistor's threshold voltage. Further complicating this consideration for an SOI transistor is that the transistor threshold voltage is affected by the potential connected to the body of the transistor, and for a completely floating body, this potential may change over time, particularly due to the various diode and capacitive effects which arise from the structure of the device. Concluding, therefore, floating body effects can influence the transistor threshold voltage, which can influence the transistor drive capability and thereby influence the desired relative ordering set forth above. This conclusion is further appreciated from the following detailed examination of an SOI transistor as well as the prior art treatment of these considerations.

Figure 2A:
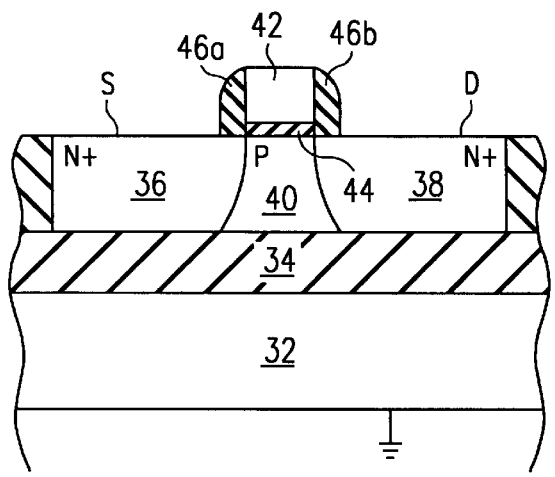
FIG. 2a illustrates a cross-sectional view of the semiconductor fabrication of a silicon-on-insulator (SOI) transistor.

FIG. 2a illustrates a cross-sectional view of a prior art SOI transistor designated generally at 30 and, thus, of the type which may be used to form each of the transistors in FIG. 1b. Starting at the bottom of the Figure, transistor 30 includes a semiconductor substrate 32 which is a layer of P type semiconductor and is typically connected to ground. As the SOI name suggests, an insulating layer 34 is formed over substrate 32. Overlying insulating layer 34 are various regions which give rise to the various pn junctions and gate operation of the device. Specifically, two N+ regions 36 and 38 are formed over insulating layer, where one of these regions operates as the source of transistor 30 while the other operates as its drain. For purposes of the remaining discussion, assume that N+ region 36 is the transistor source and N+ region 38 is the transistor drain. Between regions 36 and 38 is the body 40 of the device, which is formed by a P semiconductor region. A gate 42 is formed over body region 40, with a gate insulator 44 formed between gate 42 and body 40. Lastly, insulating sidewalls 46a and 46b are formed on the sides of gate 42.

Having set forth the various parts of transistor 30, reference is now directed to the general operation of the device as well as various of its electrical attributes. Specifically, one skilled in the art will readily acknowledge a positive gate-to-source voltage as applied to transistor 30 permits electrical charge to conduct between regions 36 and 38, by way of a charge path formed in body 40. However, note now some additional observations which arise from the various interfaces between the parts of transistor 30, as further illustrated schematically in FIG. 2b. First, note that the structure of transistor 30 gives rise to four capacitive interfaces, shown as capacitors C1 through C4 in FIG. 2b. Two of these capacitors, namely C1 and C2, are formed between body 40 and regions 36 and 38 due to the charge layer which forms in body 40 during the operation of transistor 30. A third capacitor, C3, exists between gate 42 and body 40 (i.e., due to gate insulator 44). Finally, a fourth capacitor, C4, exists between body 40 and substrate 32 (i.e., due to insulator layer 34). Second, note that the structure of transistor 30 gives rise to two diodes (i.e., pn junctions), the first being shown in FIG. 2b as diode D1 between body 40 and region 36, and the second being shown as diode D2 between body 40 and region 38.

Figure 2B:
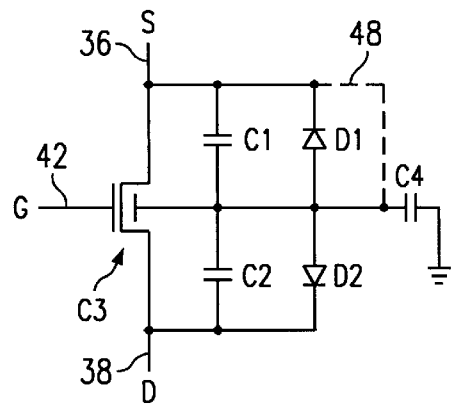

Given the illustrations of FIGS. 2a and 2b, attention is now directed to the possible effects of various of the above-introduced capacitors and diodes. To better appreciate these effects, consider the possible consequences if the body of a single SOI transistor is not connected to a fixed potential (i.e., the body is left floating). Particularly, assume over time that the transistor is enabled in numerous instances. In other words, during each of these instances the gate-to-source voltage is positive. As a result, the body voltage will tend toward the source voltage due to diode D1. However, if the body voltage moves more positive, then there may be conduction through diode D1 while if the body voltage moves more negative, then there may be reverse leakage current across that diode. As another observation, note further that if body 40 floats, then due to the various capacitances a change in any of the voltages at any of the source, drain, or gate, will tend to pull the body voltage in the same direction as the change in source, drain, or gate voltage. Concluding, therefore, one skilled in the art will appreciate that the body voltage, and hence the threshold voltage of the SOI transistor, will fluctuate in response to the recent signal history of the device.

Having understood the above, note now the prior art manner of responding to the above considerations by tying the body to a fixed voltage such as the source of the transistor as is done for drive transistors DT1 and DT2. To appreciate this effect, note that FIG. 2b further illustrates a connection 48 shown in phantom, where that connection actually exists when the body is tied to the source of the SOI transistor. Given connection 48, note that it effectively short circuits any effect of capacitor C1 and diode D1. Thus, various of the tendencies of the body voltage described above are removed by connection 48. In addition (or as an alternative for access transistors AT1 and AT2), if the source of the device is connected to a known potential (e.g., ground), then the body potential is likewise fixed by connection 48 and thus is not influenced by other potentials as well (e.g., a potential as applied to gate 42 or drain region 38). Given these effects, it now should be appreciated why the prior art emphasizes connecting the transistor body to the transistor source (and/or to ground) as is the case for various schemes including that of memory configuration 20 of FIGS. 1a and 1b, especially where matching of transistor threshold voltages is important.

As a final consideration for purposes of later comparison to the preferred embodiment, note that the semiconductor layout implementation of FIG. 1b requires consideration for each of the body connections of access transistors AT1 and AT2 (as well as the body connections of drive transistors DT1 and DT2). For example, these connections will affect the possible shape of the layout. As another example, each of the different connections will require area on the integrated circuit. As appreciated below, the preferred embodiment simplifies these considerations.

Figure 3:
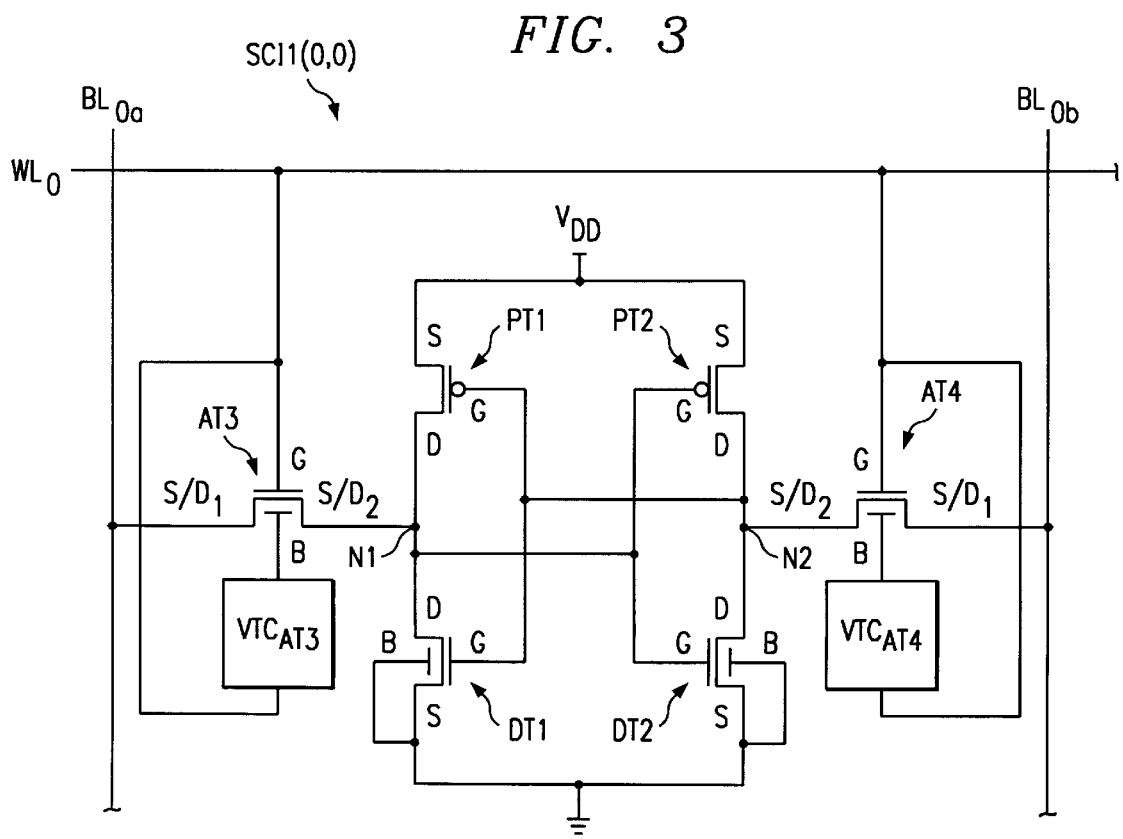
FIG. 3 illustrates a schematic of a memory cell in accordance with the present inventive embodiments, wherein the body of the access transistors in the cell are coupled to the wordline for the cell.

FIG. 3 illustrates a schematic of a storage cell SCI1(0,0) in accordance with the present inventive embodiments and, more particularly, as a substitute for storage cell SC(0,0) as shown in FIG. 1b. For sake of providing a distinction in the reference indicators, note that an "I" is added to the designation of the storage cell circuit of FIG. 3 to generally distinguish it from the storage cell of FIG. 1b, and a "1" is also added to distinguish this cell from additional embodiments described later. However, it should be understood that other than the schematic and layout considerations presented below, it is intended for the present inventive embodiments that a memory configuration may be constructed in the same manner as shown in FIG. 1a, but substituting a storage cell of the type shown by storage cell SCI1(0,0) in place of each of the storage cells shown in FIG. 1a. Thus, the preferred embodiments contemplate an integrated circuit with storage cells consistent with the discussion below and configured in a general sense as a memory configuration such as configuration 20. Moreover, the integrated circuit including such a memory configuration 20 may be of various different types, including but not limited to a stand alone memory integrated circuit, an application specific integrated circuit, a digital signal processor, or a microprocessor. Moreover, the integrated circuit may be constructed using semiconductor fabrication principles ascertainable by one skilled in the art, with certain aspects of the present inventive embodiments arising from the connections and layout considerations as appreciated from the following discussion.

Turning now to the details of storage cell SCI1(0,0) of FIG. 3, it is first instructive to review the similarities between it and the prior art. In this regard, storage cell SCI1(0,0) includes six transistors connected as a 6T cell with pull-up transistors PT1 and PT2 and drive transistors DT1 and DT2 all remaining unchanged. The remaining access transistors of storage cell SCI1(0,0) are connected in certain respects in a different manner than in the prior art; thus, to distinguish them from those discussed earlier, in FIG. 3 the access transistors are labeled AT3 and AT4. The differences in connections of these two transistors are detailed later. Returning first to the similarity of storage cells SC(0,0) and SCI1(0,0) and, more particularly with respect to the pull-up transistors, the gate of pull-up transistor PT1 is connected to the gate of drive transistor DT3, and further to node N4. Similarly, the gate of pull-up transistor PT2 is connected to the gate of drive transistor DT4, and further to node N3. Looking at the commonality of storage cells SC(0,0) and SCI1(0,0) with respect to the drive transistors, drive transistor DT1 has its source and body connected to ground, its gate connected to the gate of pull-up transistor PT1, and its drain connected to node N1. Similarly for drive transistor D2, it has its source and body connected to ground, its gate connected to the gate of pull-up transistor PT2, and its drain connected to node N2. Lastly, there are certain similar connections for transistors AT3 and AT4 relate to transistors AT1 and AT2, respectively, of the prior art. Specifically, the gate of access transistor AT3 is connected to wordline $WL_0$, its source/drain $S/D_1$ is connected to bitline $BL_{0a}$, and its source/drain $S/D_2$ is connected to node N1. Similarly with respect to access transistor AT4, its gate is also connected to wordline $WL_0$, its first source/drain $S/D_1$ is connected to bitline $BL_{0b}$, and its second source/drain $S/D_2$ is connected to a node N2.

A key distinction of the preferred embodiment as shown in storage cell SCI1(0,0) and its prior art counterpart described earlier arises from the coupling to the bodies of the access transistors of that cell. With respect to access transistors AT3 and AT4, note that their bodies are not connected to ground. Instead, each body in one embodiment is coupled via a corresponding threshold voltage control connection to the same wordline which is used to select the storage cell and, as appreciated below, this coupling permits the threshold voltage of transistors coupled in this manner to be changed during times when the row (and thus the cells along that row) is selected. More specifically and for purposes of later reference, the body of access transistor AT3 is coupled to wordline $WL_0$ via a threshold voltage control connection $VTC_{AT3}$ and the body of access transistor AT4 is coupled to wordline $WL_0$ via a threshold voltage control connection $VTC_{AT4}$. As detailed below, the couplings provided by $VTC_{AT3}$ and $VTC_{AT4}$ are such that the voltage on wordline $WL_0$ is used not only to provide a gate bias to the gates of access transistors AT3 and AT4, but also to provide a threshold voltage adjusting back bias to each transistor body which thereby influences the threshold voltage of these access transistors. A more detailed discussion of this aspect is provided later, while the following discussion further explores the various embodiments which arise with respect to threshold voltage control connections $VTC_{AT3}$ and $VTC_{AT4}$.

FIGS. 4a and 4b illustrate varying techniques for implementing threshold voltage control connections $VTC_{AT3}$ and $VTC_{AT4}$. In each embodiment, the particular technique preferably depends on whether the access transistors are formed as bulk transistors or as SOI transistors and, if the latter is used, the technique preferably further considers whether the SOI transistor is partially or fully depleted. Each of these situations is further explored below.

FIG. 4a illustrates the preferred technique of implementing threshold voltage control connections $VTC_{AT3}$ and $VTC_{AT4}$ when the access transistor at issue is formed using SOI technology, and where the SOI transistor is a fully depleted transistor. By way of introduction and as known in the art, an SOI transistor may be formed as a fully depleted transistor by considerations with respect to factors such as the thickness of the transistor body as well as its doping density. More particularly, adjustments are made in view of these considerations so that, given the anticipated operation through applying charge to the transistor, the voltages and work functions will tend to deplete (i.e., push out) all the mobile charge from the lower part of the body region; when this occurs, the transistor is said to be fully depleted. Having an understanding of this background, FIG. 4a illustrates access transistor AT3 by way of example, and it should be understood in this example that access transistor AT3 is a fully depleted SOI transistor. Given this assumption, note that voltage from wordline $WL_0$ is coupled via a capacitor C1 to the body of access transistor AT3. The inclusion of capacitor C1 is intended to demonstrate that the coupling represents the effect of transferring the electric field created by the wordline bias to the transistor body via a dielectric, but note that in the preferred embodiment a discrete or separate capacitor device is not necessarily formed solely for this function. Instead, in the preferred embodiment the coupling is such that the wordline bias is provided by a conductor which extends in an area proximate the body of the transistor, yet the conductor and the body are actually separated by some distance filled with a dielectric. Given the dielectric, the nature of the back bias coupling is such that the electric field from wordline $WL_0$ directly influences the threshold voltage of the transistor. A particular method and structure to accomplish this coupling is detailed below in FIGS. 8 through 10. Lastly, it is noted that while this coupling via a dielectric is preferred with respect to a fully depleted SOI transistor, an alternative embodiment may be created where there is a direct contact between the wordline and the transistor body; however, it is further noted that such an approach will affect the transistor operation in a different manner than the preferred approach of a coupling via a dielectric.

FIG. 4b illustrates the preferred technique of implementing threshold voltage control connections $VTC_{AT3}$ and $VTC_{AT4}$ when the access transistor at issue is formed using bulk technology, or where SOI technology is used and the SOI transistor is a partially depleted transistor. For the example of a partially depleted transistor, and given the preceding statements pertaining to a fully depleted transistor, it should be understood by way of contrast that in a partially depleted transistor, its body includes an area, at the bottom of the body, which represents an undepleted region, and above that region there is a further region that represents a depleted region in the transistor body. It is for this reason that the transistor is referred to as partially depleted. In any event, looking now in detail to FIG. 4b it illustrates access transistor AT3 by way of example, and it should be understood in this example that access transistor AT3 is either a bulk transistor or a partially depleted SOI transistor. Given either assumption, note that voltage from wordline $WL_0$ is coupled via a direct connection to the body of the transistor. For example in the context of a bulk transistor, such a connection may be made by providing a contact directly to the well of the bulk transistor. As an example in the context of a partially depleted SOI transistor, such a connection may be made by providing a contact through the dielectric coupling described below with respect to FIGS. 8 through 10. The direct connection optionally may be an ohmic contact or a diode contact as with a p-n junction or a Schottky contact. Also, in the context of the partially depleted SOI, note that the electric field from wordline $WL_0$ couples to the undepleted region at the bottom of the transistor body; this coupling in turn influences the threshold voltage of the transistor. Lastly, while the preferred embodiment contemplates a direct wordline-to-body connection for either the bulk or partially depleted SOI transistor, alternative embodiments are further contemplated where a coupling via another dielectric, such as suggested with FIG. 4a, is instead used to influence the transistor body with the wordline voltage.

Having now set forth the various techniques available in the present embodiments for coupling the wordline voltage to the body of each access transistor, the effect of such a coupling is now explored by returning to storage cell SCI1 (0,0) of FIG. 3 and discussing its operation. In this regard, recall first that it is stated above that the inventive cell SCI1(0,0) is preferably duplicated for all cells in a memory system and, thus, by way of example may be included in memory configuration 20 of FIG. 1. In any event, the following further explores the operation of cell SCI1(0,0), both alone and in the context of an array such as in memory configuration 20. By way of introduction and to simplify the following discussion, first the operation of memory configuration 20 is discussed for those times when an access is not occurring and, then second follows a discussion where an access (i.e., either read or write) is desired.

During times when memory configuration 20 is not being accessed, all wordlines $WL_0$ through $WL_N$ are inactive and, hence, are typically connected to a ground potential. Looking to FIG. 3, therefore, this ground potential is coupled (either via a direct connection or coupling via a dielectric) to the gate of each of access transistors AT3 and AT4, and also as a first back bias to the bodies of these access transistors AT3 and AT4. Consequently, for each cell, these n-channel transistor access transistors AT3 and AT4 are turned off. In this off condition, each of access transistors AT3 and AT4 has a threshold voltage, which for purposes of discussion is designated here as VT1. Moreover, the value of VT1 is determined in part due to the value of the back body potential coupled to the body of the access transistor; thus, VT1 relates to the ground potential coupled to each access transistor body.

Now assume that it is desirable to access memory configuration 20. As known in the art, such an action is typically instigated by the application of an address to memory configuration 20, which is also accompanied by a control signal (e.g., a row address strobe or "RAS" signal). Thereafter, a single one of the wordlines $WL_0$ through $WL_N$ is selected typically by decoding the address and asserting a high voltage along the wordline where the wordline is used to gate n-channel transistors. For purposes of example, assume that it is wordline $WL_0$ of FIG. 3 that is selected. Consequently, the asserted voltage on wordline $WL_0$ is coupled to both the gate and body of each of access transistors AT3 and AT4. As a result, for each cell, these n-channel access transistors AT3 and AT4 are turned on. In addition, note that by increasing the voltage coupled as a second back bias to the bodies of access transistors AT3 and AT4, the threshold voltage of each transistor is reduced. Accordingly, for purposes of discussion, this different threshold voltage resulting from the second back bias is referred to as VT2, and it is now appreciated that VT2 is less than VT1. As a result, during the access of the cells for a given wordline, each access transistor in each cell which has its body coupled to the corresponding wordline has a reduction in its threshold voltage. As is known in the art, for a transistor having a relatively lower threshold voltage, it provides a corresponding increase in relative drive current. As a result, the higher drive current causes the transistor to transition faster and have a higher drive current than a transistor with a higher threshold voltage. Thus, during this access operation, each of access transistors AT3 and AT4 (as well as any and all other transistors along the selected wordline which have their bodies influenced by the wordline potential) transitions faster than it would if its body were still connected to ground.

Having now noted the relation of VT1 to VT2, note now a further benefit of the use of the first back bias to cause VT1 during the non-active state. Particularly, in opposite fashion to the drive current principle described above, it is also known for a transistor having a higher threshold voltage that it provides a corresponding reduction in leakage current as compared to a transistor with a lower threshold voltage. Thus, during the non-activated state described above, each of the transistors has a relatively higher threshold voltage of VT1 and, consequently, its leakage current will be less than if the threshold voltage of VT2 existed at that time for such transistors. Importantly, note further that this same principle applies during the active state, but in regard to those cells which are aligned along non-selected wordlines (i.e., along wordlines other than the active wordline). In other words, for the example where $WL_0$ is selected, then each of the access transistors having their bodies receiving the second back bias from the potential of $WL_0$ will have a threshold voltage of VT2. However, during that same access, the cells in the non-selected rows, that is, those rows corresponding to wordlines $WL_1$ through $WL_N$, still have their bodies coupled to the potential of those wordlines $WL_1$ through $WL_N$ (i.e., to the first back bias which is ground). As a result, even during this active state these additional transistors, which in contemporary memories form a large majority of the total number of memory cells in the memory array, still have a threshold voltage equal to VT1. Accordingly, the leakage current for these transistors will be reduced as compared to the leakage which would occur if the increased wordline bias also were coupled to the bodies of these transistors.

FIG. 5 illustrates a schematic of a storage cell SCI2(0,0) also in accordance with the present inventive embodiments and, again, which may be used as a substitute for storage cell SC(0,0) as shown in FIG. 1b. Once again, therefore, it is contemplated that a storage cell of the type shown by storage cell SCI2(0,0) may be used in place of each of the storage cells shown in FIG. 1a, and in the context of various memory inclusive integrated circuits, such as a stand alone memory integrated circuit, an application specific integrated circuit, a digital signal processor, or a microprocessor, where each may use one of various different semiconductor fabrication principles. Turning to the details of storage cell SCI2(0,0), note that its connections are identical to those of storage cell SCI1(0,0) of FIG. 3 with the exception of the body connections of the drive transistors in the cell. Accordingly, since the drive transistors are connected in a different manner, in FIG. 5 they are referred to as drive transistors DT3 and DT4. More specifically, for each drive transistor, its body is not connected to its source as in the case of the prior art. Instead, the body of drive transistor DT3 is connected to the output of threshold voltage control connection $VTC_{AT3}$ and the body of drive transistor DT4 is connected to the output of threshold voltage control connection $VTC_{AT4}$. From FIGS. 4a and 4b, therefore, it should be recalled that these connections may be achieved by either a direct connection or a coupling via a dielectric to the corresponding wordline (i.e., wordline $WL_0$ in the example of FIG. 5).

Given the connections described immediately above, one skilled in the art will appreciate that in operation of cell SCI2(0,0) the wordline bias provides a back bias to the bodies of drive transistors DT3 and DT4 in a like manner as it is applied to the bodies of the access transistors as described above. In this context, note that for the drive transistors it is desirable to have more drive current capacity during a READ operation (as opposed to a WRITE) for cell stability and speed. Conversely, for a WRITE operation, drive current capacity is not as critical, but there is still some performance benefit to reducing the pull down drive. Given these considerations, note that the coupling of the wordline bias to the bodies of the drive transistors DT3 and DT4 effectively increases the drive current capability when a given row of cells are accessed (i.e., when all the cells corresponding to a given wordline are accessed). More specifically, the asserted voltage on the wordline is also used to affect the threshold voltage of the drive transistors and, hence, increase their drive current capacity for either a READ or a WRITE. As an alternative embodiment, note further that separate conductors could be used to apply a back bias to the drive transistors as opposed to the access transistors, such that only one or the other type of transistor receives a threshold voltage lowering back bias in certain instances, or still further such that both types of transistors receive a threshold voltage lowering back bias in certain instances. Still further, for controlling the back bias to the drive transistors, additional circuitry could be provided to provide the threshold voltage lowering back bias differently for a READ versus for a WRITE. For this alternative, preferably a separate circuit is included proximate the connection of the wordline driver, where this separate circuit is responsive to whether a requested access is either a READ or a WRITE; in response, therefore, for the given row to be accessed, this separate circuit may determine from the given access type (i.e., READ or WRITE) whether it is desirable to apply a threshold voltage lowering back bias to the bodies of all the drive transistors along the accessed row. In any event, there are converse benefits arising from the threshold voltage adjustment when the row is not being accessed (i.e., is not selected) which, recall for the preferred embodiment, occurs either when the entire memory configuration is not being accessed or when another row corresponding to a different wordline is selected. More specifically, during these inactive periods the drive transistors have a relatively high threshold voltage and, therefore, have reduced leakage currents.

Having presented the differing options from cells SCI1(0,0) and SCI2(0,0) of FIGS. 3 and 5, respectively, note that still additional embodiments may be created from various of the concepts illustrated by those cells. For example, yet another embodiment may be created where for each storage cell the drive transistors have their body potentials affected by the wordline bias while the body potential of the access transistors is not so affected. In this case, therefore, the body potential of the access transistors are connected elsewhere, such as to ground or left floating. As yet another alternative, additional switching may be included such that for certain operations the wordline bias affects the body potential of both the access transistors and the drive transistors, while for other operations it only affects one of the two types of transistors. For example, an embodiment may be desirable where the threshold voltage of the drive transistors is lowered during a READ operation while the threshold voltage of the access transistors during that same READ operation is not affected (e.g., for an n-channel access transistor its body is left connected to ground). This may provide for a stable memory cell with narrower pull down transistors. As yet another example, an embodiment may be implemented where the pull-up transistors PT1 and PT2 also have their bodies connected to receive a back bias. In this regard, however, it is preferable to lower the threshold voltage of pull-up transistors PT1 and PT2 when the memory is not being accessed, and raise the threshold voltage of pull-up transistors PT1 and PT2 during a write operation; for a read operation, the threshold voltage may be either the high or low threshold voltage. Still other examples will be ascertainable by one skilled in the art.

Figure 6:
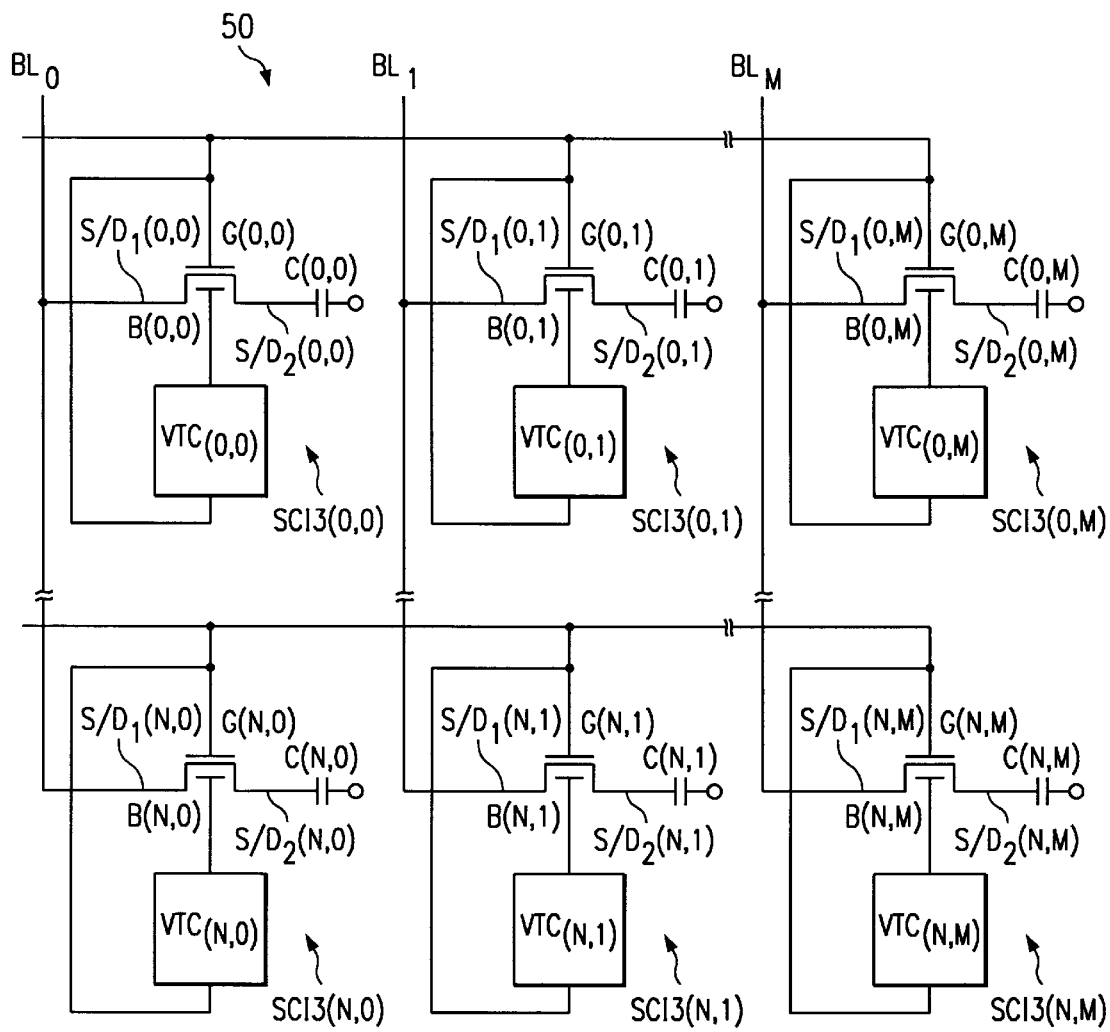
FIG. 6 illustrates a DRAM memory configuration according to another inventive embodiment.

FIG. 6 illustrates a memory configuration 50 which represents yet another embodiment within the present inventive scope. In general, the array alignment of memory configuration 50 is similar to that of memory configuration 20, but memory configuration 50 is a DRAM memory in that its cells are DRAM memory cells as opposed to SRAM cells. Given this difference, while memory configuration 50 includes a number of wordlines $WL_0$ through $WL_N$ each aligned along a row in the x-dimension, its columns correspond to single bitlines $BL_0$ through $BL_M$ rather than differential bitlines as in the case of FIG. 1. In any event, at the intersection of each wordline and bitline is a storage cell abbreviated SCI3, where each cell has a coordinate (WL, BL) such that the first element specifies the wordline corresponding to the storage cell and the second element specifies the bitline corresponding to the storage cell. As in the case of FIG. 1, the array nature of memory configuration 50 permits either writing data to, or reading data from, a storage cell on a wordline basis. More specifically, the signal provided either from or to each bitline in FIG. 6 is connected to corresponding sense amplifier circuits, shown as $SA_0$ through $SA_M$, which again may be used to either read or write a cell connected to the same bitline as the sense amplifier circuit.

Looking now more closely to the individual cells of memory configuration 50, in general each includes an access transistor and a storage element (e.g., capacitor) as known in the art. By way of example, cell SCI3(0,0) includes an access transistor AT(0,0), which has its gate connected to wordline $WL_0$, a first source/drain $S/D_1(0,0)$ connected to bitline $BL_0$ and a second source drain $S/D_2(0,0)$ connected to a capacitor C(0,0). Thus, by activating access transistor AT(0,0), a charge may be written to, or read from, capacitor C(0,0). Beyond these connections and operation, however, in the preferred embodiment each storage cell further includes a threshold voltage control connection so that the voltage on the wordline corresponding to the cell may be used to apply a back bias to the access transistor and thereby affect the threshold voltage of the transistor. For example, in cell SCI3(0,0), there is a threshold voltage control connection $VTC_{(0,0)}$ connected between wordline $WL_0$ and the body of the transistor. The specific technique used to implement threshold voltage control connection $VTC_{(0,0)}$ may again be ascertained with reference to FIGS. 4a and 4b. Thus, where access transistor AT(0,0) is a bulk transistor, threshold voltage control connection $VTC_{(0,0)}$ preferably represents a direct connection between wordline $WL_0$ and the well of the transistor; where access transistor AT(0,0) is a partially depleted SOI transistor, threshold voltage control connection $VTC_{(0,0)}$ preferably represents a direct connection between wordline $WL_0$ and the body of the transistor; and where access transistor AT(0,0) is a fully depleted SOI transistor, threshold voltage control connection $VTC_{(0,0)}$ preferably represents a capacitive connection between wordline $WL_0$ and the body of the transistor. In any event, one skilled in the art will appreciate from the earlier discussion that the provision of a back bias to the transistor from the corresponding wordline increases drive current of the transistor during the time the wordline is asserted, and raises the threshold voltage of the transistor when the wordline is not asserted.

Figure 7:
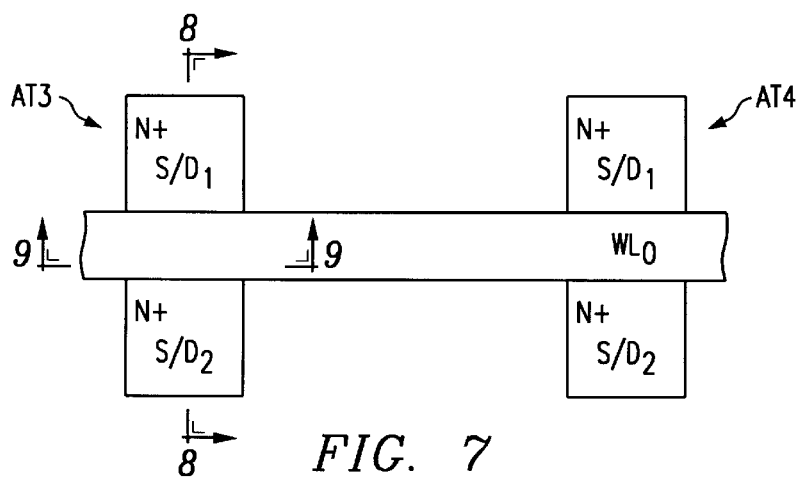
FIG. 7 illustrates a plan view of the semiconductor layout of the access transistors of the cell of FIG. 3.
Figure 8:
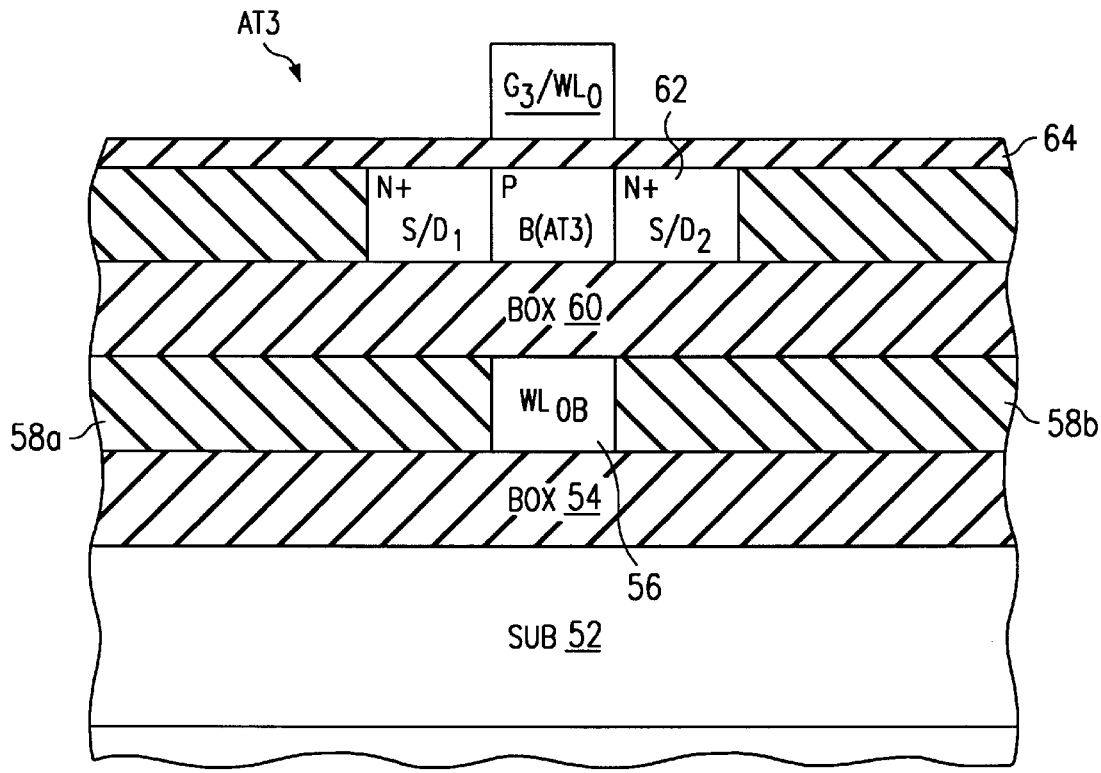
FIG. 8 illustrates a cross-sectional view of the layout of FIG. 7, taken across the source/drains and body regions of access transistor AT3.
Figure 9:
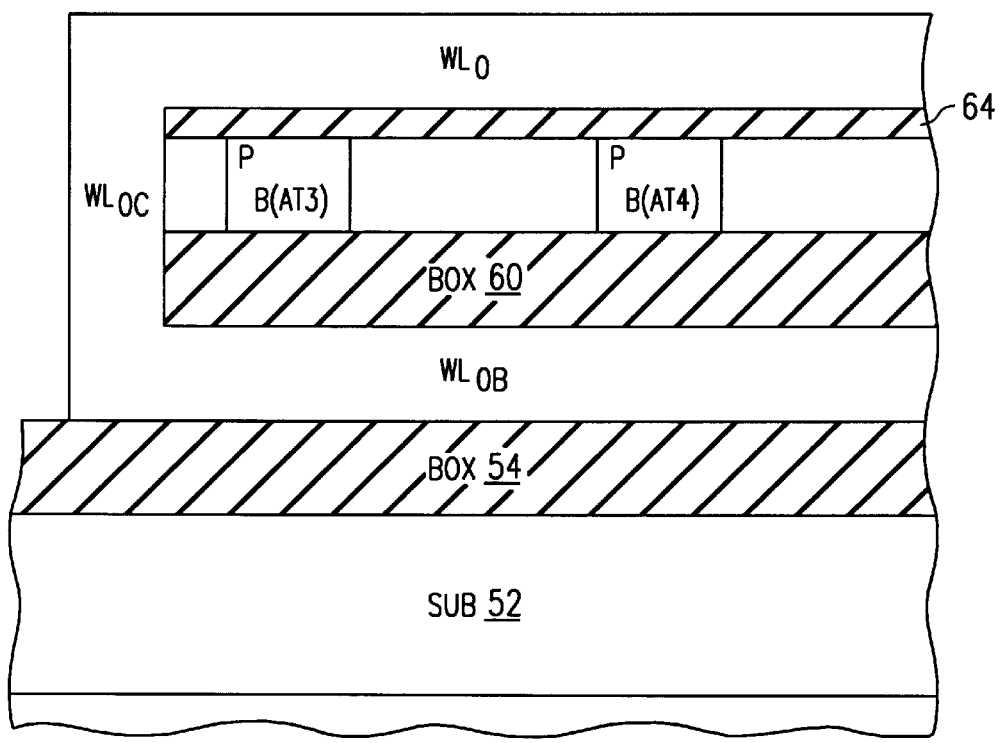
FIG. 9 illustrates a cross-sectional view of the layout of FIG. 7, taken across the wordline $WL_0$.

FIGS. 7, 8, and 9 illustrate semiconductor layout illustrations for constructing SOI access transistors having a back bias imposed on the transistor from a corresponding wordline. Since numerous examples are provided above of such types of access transistors, the following illustrations and discussion are simplified by using access transistors AT3 and AT4 from cell SCI1(0,0) FIG. 3 by way of example. Also to simplify the following, the remaining transistors from cell SCI1(0,0) are neither shown nor further discussed. Given these introductions, each of these Figures is further explored below.

Looking to FIG. 7, it shows a plan view of access transistors AT3 and AT4. From this view, it is seen how worldline $WL_0$ may extend in a dimension (e.g., horizontal), and between the source/drain regions of each transistor. Thus, in the present example where each access transistor is an n-channel transistor, then beneath wordline $WL_0$ is a p-type semiconductor region (not visible in FIG. 7) and $WL_0$ passes between the n-type source/drain regions of each transistor.

Turning to FIG. 8, it illustrates a cross-sectional view through the source/drain regions of access transistor AT3. The cross-sectional device as illustrated may be formed using various techniques, one of which is provided later by way of example. In any event, from the FIG. 8 perspective, the SOI nature of access transistor AT3 may be appreciated. Additionally, FIG. 8 presents an illustration of a manner of capacitively coupling wordline $WL_0$ to provide a back bias to the body of the transistor. More specifically, in FIG. 8 there is shown a semiconductor substrate 52, over which is formed a buried oxide ("BOX") layer 54. Overlying buried oxide layer 54 is what is referred to generally herein as a buried conductor, where this buried conductor is electrically connected to wordline $WL_0$; thus, for purposes of later reference, the resulting structure is referred to as a buried wordline, and a "B" is added to the subscript leaving a designation as $WL_{0B}$. In the preferred embodiment, buried wordline $WL_{0B}$ runs parallel to, and has approximately the same dimensions, as the wordline $WL_0$ to which it is connected. Beyond the edges defined by these dimensions and at the same horizontal plane as buried wordline $WL_{OB}$ are additional insulator regions 58*a* and 58*b*. Overlying buried wordline $WL_{OB}$ and insulator regions 58*a* and 58*b* is another buried oxide layer 60, over which there is a semiconductor layer 62 in which the transistor source/drain regions and transistor body area formed. In the current example of an n-channel transistor, the source/drain regions $S/D_1$ and $S/D_2$ are N+ type regions and the body region B is a P− type region. At this point, therefore, note that a coupling via a dielectric exists between buried wordline $WL_{OB}$ and body B since the two are separated by a dielectric, namely, a portion of BOX layer 60. Completing the discussion of FIG. 8, overlying layer 62 is a gate oxide layer 64, over which is formed a conductor which serves both as wordline $WL_0$ and the gate conductor for access transistor AT3 and, thus, which is labeled as $G_3/WL_0$.

Looking now to FIG. 9, it illustrates a cross-sectional view along the length of wordline $WL_0$. From this perspective, it may now be appreciated, as introduced above, that wordline $WL_0$ and buried wordline $WL_{OB}$ run in parallel fashion, with wordline $WL_0$ passing above the bodies of access transistors AT3 and AT4 (as well as any other access transistors corresponding the row controlled by wordline $WL_0$) while buried wordline $WL_{OB}$ passes below the bodies of those transistors. Moreover, in the illustrated example, a vertical wordline contact $WL_{OC}$ is formed between wordline $WL_0$ and buried wordline $WL_{OB}$ and, thus, as discussed extensively above, the voltage on wordline $WL_0$ is also connected to supply a voltage to buried wordline $WL_{OB}$. As a result, this voltage is capacitively coupled to the bodies of the access transistors which have their gates also controlled by wordline $WL_0$. As also detailed below with respect to FIG. 11, note that the use of vertical wordline contact $WL_{OC}$ is by way of example, and an alternative embodiment is contemplated for the various memory cells herein where each of wordline $WL_0$ and buried wordline $WL_{OB}$ is electrically disconnected from one another and are separately controlled.

Figure 10A:
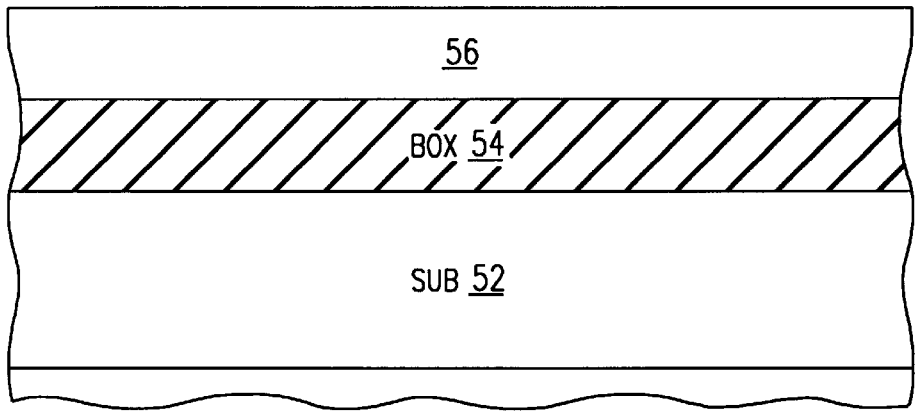
FIG. 10a illustrates a cross-sectional view of a first set of steps to form the layout of FIG. 8.
Figure 10B:
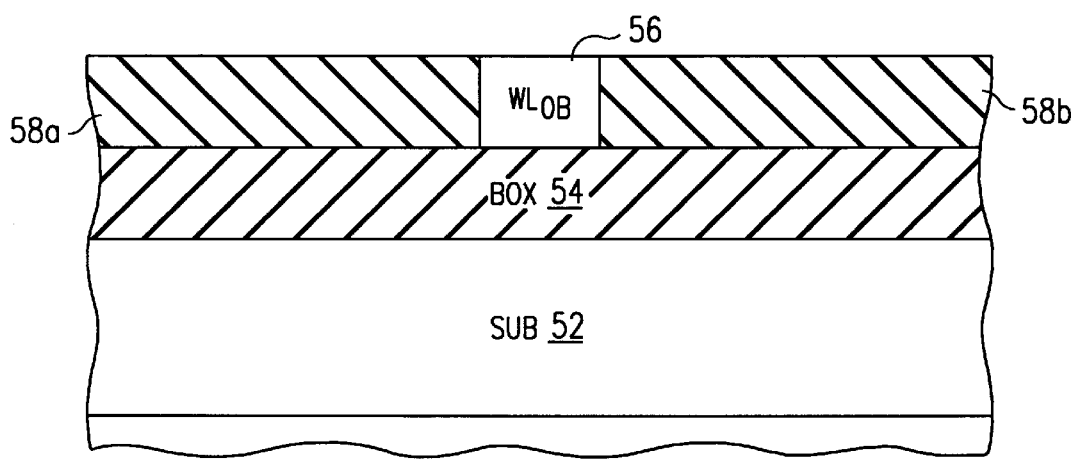
FIG. 10b illustrates a cross-sectional view of a second set of steps to form the layout of FIG. 8.
Figure 10C:
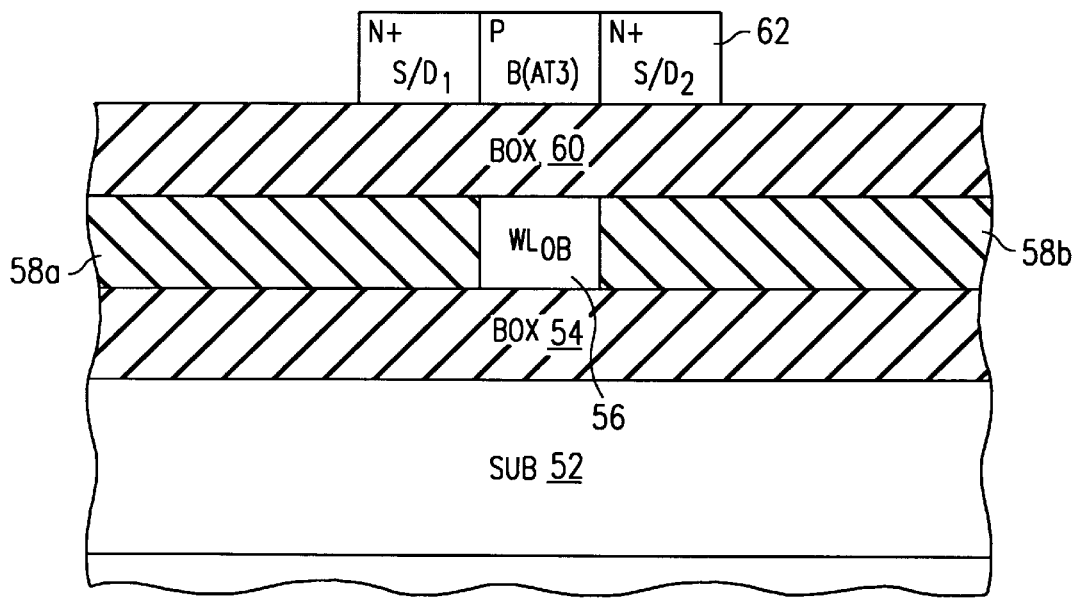
FIG. 10c illustrates a cross-sectional view of a third set of steps to form the layout of FIG. 8.

By way of example and illustration, FIGS. 10*a* through 10*c* demonstrate one method under which the structure of access transistor AT3 shown in FIG. 8 may be constructed. Looking first then to FIG. 10*a*, initially there is provided substrate 52, preferably of silicon, having a first buried dielectric layer 54 thereover, preferably silicon dioxide. A buried electrically conductive layer 56, preferably doped single crystal silicon or polysilicon or a refractive metal such as tungsten, is provided over dielectric layer 54. Alternatively, electrically conductive layer 56 may be nonconductive, such as undoped polysilicon or undoped single crystal silicon, which could be made selectively conductive by subsequent doping. Turning next to FIG. 10*b*, the buried electrically conductive layer 56 has been patterned and etched, such as in a standard manner, to leave the portion which forms the buried wordline $WL_{OB}$ in FIG. 8. On both sides of this remaining portion of the buried electrically conductive layer 56, insulating regions 58*a* and 58*b* are formed. These insulating regions may be formed, by way of example, by deposition and planarization. Turning still further to FIG. 10*c*, it illustrates a second buried dielectric layer 60, preferably silicon dioxide, which is provided over the remaining portion of electrically conductive layer 56 as well as over insulating regions 58*a* and 58*b*. Optionally, dielectrics 58*a*, 58*b*, and 60 are formed with a single deposition and planarization. Alternatively, buried oxide 60 is formed on the device layer prior to bonding. In any event, thereafter a patterned film of semiconductor (e.g., silicon) 62 is formed, where through the patterning process and a doping process each of the source/drains and the body of access transistor AT3 is formed. From this resulting structure, one skilled in the art will readily appreciate the addition of further insulating regions to the sides of the source/drain regions, as well as a gate oxide layer 64 and finally the conductor which serves both as wordline $WL_0$ and the gate conductor for access transistor AT3.

Figure 11:
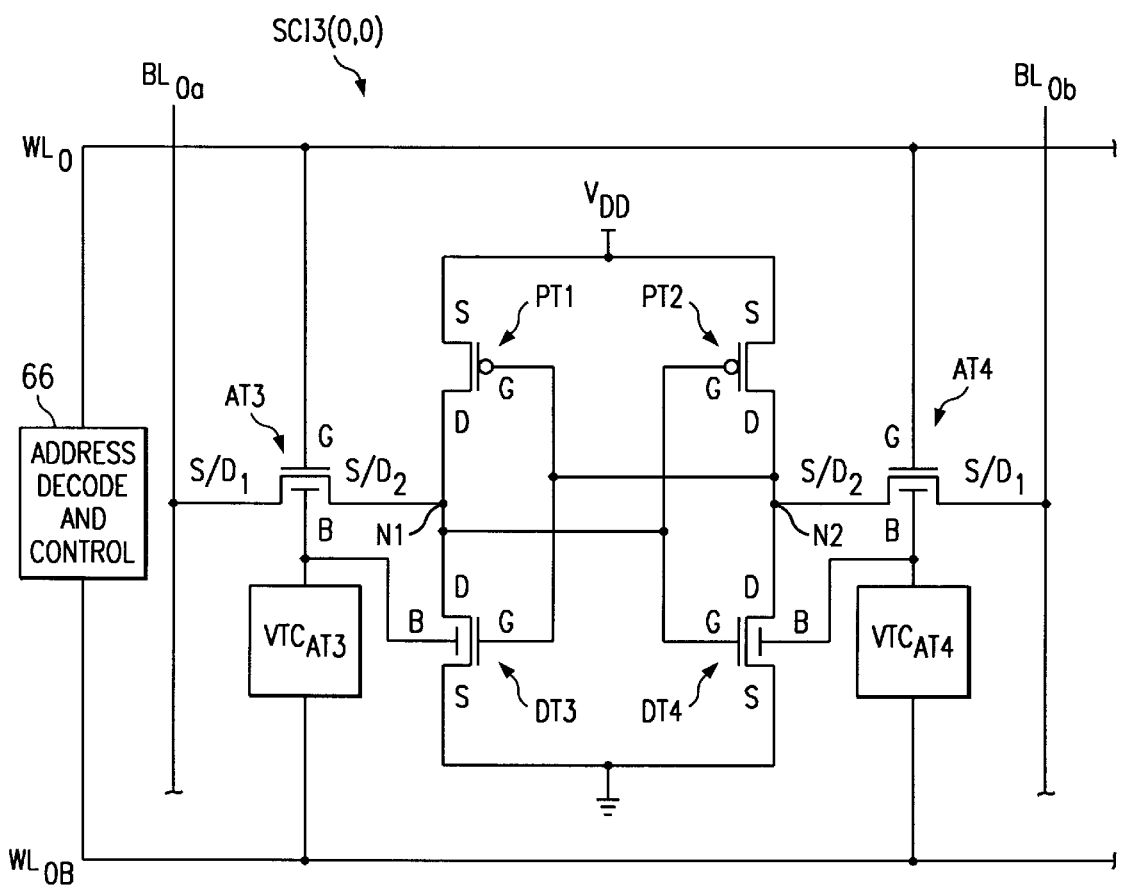
FIG. 11 illustrates a schematic of a memory cell in accordance with the present inventive embodiments, wherein the bodies of the access transistors and the drive transistors in the cell are coupled to receive a back bias from a conductor electrically disconnected from the wordline for the cell.

FIG. 11 illustrates a schematic of a storage cell SCI3(0,0) also in accordance with the present inventive embodiments and, again, which may be used as a substitute for storage cell SC(0,0) as shown in FIG. 1*b*. Storage cell SCI3(0,0) differs from storage cell SCI2(0,0) in only one respect and, thus, for the similarities the reader is assumed familiar with the earlier discussion of storage cell SCI2(0,0). As to the difference, in storage cell SCI3(0,0), its threshold voltage control connections $VTC_{AT3}$ and $VTC_{AT4}$ are not to wordline $WL_0$. Instead, they are connected to a separate conductor, which by way of example in FIG. 10 is shown as a buried wordline $WL_{OB}$. In this regard, recall it was stated above with respect to FIG. 9 that an alternative embodiment is contemplated where wordline $WL_0$ is electrically disconnected and separately controlled relative to buried wordline $WL_{OB}$. This alternative embodiment, therefore, is schematically illustrated in FIG. 11. The separate control is shown by way of example via an address decoder and control circuit 66. In this illustration, circuit 66 receives an address and, as it is decoded, then the row including cell SCI3(0,0) may be accessed by asserting $WL_0$, and the threshold voltage of the cells along that row may be affected by asserting $WL_{OB}$. In the current example, both the access and drive transistors are shown to be affected by $WL_{OB}$, but alternative embodiments may be formed where only one or the other is affected, or each could be separately controlled by including yet another separately controlled conductor. In any of these alternatives, separate drivers are included within circuit 66 and used for each of wordline $WL_0$ and buried wordline $WL_{OB}$. Each driver then preferably acts to supply a bias only for the same single row at a time. In this manner, therefore, when wordline $WL_0$ is selected, preferably only the corresponding buried wordline $WL_{OB}$ is asserted and, as a result, the threshold voltages of the transistors in only the accessed row of the array are influenced during that time period. Moreover, by separating wordline $WL_0$ and buried wordline $WL_{OB}$ in this manner, note that the duration of asserting wordline $WL_0$ may be different than the duration of asserting buried wordline $WL_{OB}$, if such an approach is found desirable in certain circumstances, where in any event there is still some overlapping time period during which both a front bias is applied via wordline $WL_0$ and a back bias is applied via buried wordline $WL_{OB}$.

From the above, it may be appreciated that the above embodiments provide numerous alternatives to improve existing memory designs, and do so by way of example by lowering the threshold voltage of various cell transistors in a single memory row during a period of time which corresponds to access of those cells. Thus, during those times the transistors, such as access or drive transistors, or both, provide greater drive current capacity than would otherwise be the case if the threshold voltage of the transistor were unaffected. In addition, during periods when these transistors are not enabled, the threshold voltage of these transistors is relatively increased, thereby reducing current leakage during such times. Also from the above it should be appreciated that the present inventive scope encompasses numerous embodiments, as well as alterations thereof and still further embodiments as may be developed by one skilled in the art given the present teachings and the numerous preceding examples. Indeed, still other examples exist, such as is the case in changing the conductivity type of various of the transistors discussed herein. As another, while the preceding illustrations have shown a single memory array, structures using numerous arrays such as memory bank systems also may implement the present embodiments. As still another example, an alternative may be formed wherein the buried conductor is permitted to provide a first back bias to both the selected row and some of the non-selected rows in a given array, while not providing that first back bias to all of the non-selected rows. Instead, a second back bias is applied to most or all of the remaining non-selected rows which do not receive the first back bias. More specifically as to this example, as an address is being decoded, a preliminary determination from the address could identify a block of rows which will include the row to be selected, in which case each row in that block receives the first back bias. Consequently, each cell within the block and connected to receive the first back bias then has its threshold voltage set to one level, while the cells in the other rows of the array and not in that block receive a different back bias and, therefore, have their threshold voltages set to a different level. These levels again are set in the manners stated above (e.g., high for an access transistor in the accessed row, and low for an access transistor in a block of rows not including the selected row). As the address is further decoded, then only one of the rows in the block is actually accessed, while the other cells in the same block nevertheless receive the same back bias as the accessed row. Note that this alternative, however, may not be preferred because the additional non-selected rows in the block constitute an additional load (e.g., capacitance) on the back bias, and the cells therein will provide additional leakage. In any event, the many variations described above further demonstrate that while the present embodiments have been described in detail, various substitutions, modifications or alterations could be made to the descriptions set forth above without departing from the inventive scope which is defined by the following claims.

What is claimed is:

1. A memory configuration, comprising:

a memory array comprising a plurality of memory cells arranged in a plurality of rows and columns;

a plurality of wordlines, wherein each of the plurality of wordlines corresponds to one of the plurality of rows and is operable during a period to provide a gate bias to select the row corresponding to the wordline such that other rows in the plurality of rows are non-selected rows during the period, wherein each of the plurality of memory cells comprises at least one transistor coupled to receive a back bias;

circuitry for providing a first back bias operable to cause the at least one transistor in each of the memory cells in the selected row to have a first threshold voltage;

circuitry for providing a second back bias operable to cause the at least one transistor in each of the memory cells in at least some of the non-selected rows to have a second threshold voltage during the period;

wherein the first threshold voltage is different than the second threshold voltage; and wherein the at least one transistor coupled to receive the back bias is coupled to receive the back bias from a buried wordline corresponding to the row.

2. The memory configuration of claim 1 wherein the buried wordline is electrically connected to the wordline corresponding to the row.

3. The memory configuration of claim 1 wherein the buried wordline is electrically disconnected from the wordline corresponding to the row.

4. A memory configuration, comprising:

an array comprising a plurality of memory cells arranged in a plurality of rows and columns;

a plurality of wordlines, wherein each of the plurality of wordlines corresponds to one of the plurality of rows; and wherein each of the plurality of memory cells comprises at least one transistor coupled to receive a back bias from a wordline corresponding to the row on which the cell is arranged.

5. The memory configuration of claim 4 wherein the at least one transistor comprises an access transistor.

6. The memory configuration of claim 4 wherein the at least one transistor comprises a drive transistor.

7. The memory configuration of claim 4 wherein the at least one transistor comprises a pull-up transistor.

8. The memory configuration of claim 4 wherein the at least one transistor comprises each of an access transistor and a drive transistor.

9. The memory configuration of claim 4 wherein the at least one transistor is coupled to receive the back bias via a direct connection.

10. The memory configuration of claim 4 wherein the at least one transistor is coupled to receive the back bias via a dielectric coupling.

11. A memory configuration, comprising:

a memory array comprising a plurality of memory cells arranged in a plurality of rows and columns;

a plurality of wordlines, wherein each of the plurality or wordlines corresponds to one of the plurality of rows and is operable during a period to provide a gate bias to select the row corresponding to the wordline such that other rows in the plurality of rows are non-selected rows during the period, wherein each of the plurality of memory cells comprises at least one transistor coupled to receive a back bias;

circuitry for providing a first back bias operable to cause the at least one transistor in the each of the memory cells in the selected row to have a first threshold voltage;

circuitry for providing a second back bias operable to cause the at least one transistor in each of the memory cells in at least some on the non-selected rows to have a second threshold voltage during the period;

wherein the first threshold voltage is different than the second threshold voltage; and wherein the at least one transistor coupled to receive the back bias is coupled to receive the back bias from the wordline corresponding to the row.

* * * * *